United States Patent
Yang

(10) Patent No.: US 7,545,042 B2
(45) Date of Patent: Jun. 9, 2009

(54) STRUCTURE COMBINING AN IC INTEGRATED SUBSTRATE AND A CARRIER, AND METHOD OF MANUFACTURING SUCH STRUCTURE

(75) Inventor: Chih-Kuang Yang, Hsinchu (TW)

(73) Assignee: Princo Corp., Hsinchu (TW)

( * ) Notice: Subject to any disclaimer, the term of this patent is extended or adjusted under 35 U.S.C. 154(b) by 276 days.

(21) Appl. No.: 11/533,762

(22) Filed: Sep. 20, 2006

(65) Prior Publication Data

US 2007/0145602 A1    Jun. 28, 2007

(30) Foreign Application Priority Data

Dec. 22, 2005 (TW) ............... 94145832 A
Jul. 28, 2006 (TW) ............... 95127670 A

(51) Int. Cl.
*H01L 23/48* (2006.01)

(52) U.S. Cl. ............... 257/753; 257/750; 257/758; 257/E21.584

(58) Field of Classification Search ............... 257/753, 257/E23.116, E23.127, 750, 758, 773, 776, 257/777, E21.499, E21.584

See application file for complete search history.

(56) References Cited

U.S. PATENT DOCUMENTS

| 5,708,302 | A  | * | 1/1998  | Azuma et al. ............... 257/751 |
| 6,028,364 | A  | * | 2/2000  | Ogino et al. ............... 257/778 |
| 6,214,733 | B1 |   | 4/2001  | Sickmiller |
| 6,962,835 | B2 | * | 11/2005 | Tong et al. ............... 438/108 |

FOREIGN PATENT DOCUMENTS

CN          1690820          11/2005

* cited by examiner

*Primary Examiner*—Jasmine J Clark

(57) ABSTRACT

The present invention provides a structure combining an IC integrated substrate and a carrier, which comprises a carrier and an IC integrated substrate formed on the carrier. The interface between the IC integrated substrate and the carrier has a specific area at which the interface adhesion is different from that at the remaining area of the interface. The present invention also provides a method of manufacturing the above structure and a method of manufacturing electronic devices using the above structure.

11 Claims, 5 Drawing Sheets

3A

3B

3C cutting

3D

STRUCTURE COMBINING AN IC INTEGRATED SUBSTRATE AND A CARRIER, AND METHOD OF MANUFACTURING SUCH STRUCTURE

BACKGROUND OF THE INVENTION a) Field of the Invention

The invention relates to a structure combining an IC integrated substrate and a carrier fabricated by an adhesion-differentiating process, a method of manufacturing such structure, and a method of manufacturing an electronic device using such structure.

b) Description of the Related Art

As information, communication, and consumer electronic products tend to miniaturization and multi-function, the line width, line spacing, and size of chips become smaller and smaller, and the chips require faster transmission speed. In response thereto, better packaging technology for electrically connecting the chips to the exterior is required to increase the wiring density. Therefore, the chip packaging technology transformed from through hole type to surface mount type, the lead frame went from connecting by gold wire to using bumps, and circuit boards started out from hard printed circuit boards (PCB) to flexible printed circuit boards (FPCB) and to multilayer thin-film substrates.

A typical six-layer PCB with BT material weighs about 4 grams and has a thickness of about 1 mm, and thus it cannot be bent. An FPCB with a thickness of about 50 µm can only be made with two layers of interconnection. In contrast, a multilayer thin-film substrate with a thickness of about 50 µm can have six layers of interconnection and weighs about 0.21 grams in total, and therefore the multilayer thin-film substrate has the best flexibility and is the most compact. Moreover, in regard to the interconnection density, for PCB and FPCB, the minimum diameter of through holes is 50 µm, the minimum dimension of through hole bonding pads is 100 µm, and the minimum line width and line spacing are 25 µm, whereas for the multilayer thin-film substrate, the minimum diameter of through holes is 20 µm, the minimum dimension of through hole bonding pads is 25 µm, and the minimum line width and line spacing are 20 µm, and therefore the multilayer thin-film substrate greatly increases the interconnection density. The multilayer thin-film substrate, due to its flexibility, is especially suitable for products that have special limitation in size or have a structure with bending design.

In general, the aforementioned multilayer thin-film substrate is used as an IC packaging substrate, playing a conventional role of electrical signal transmission and interface connection. With requirements of the electronic products heading towards high functionality, high-speed signal transmission, and high-density circuitries, the multilayer thin-film substrate technology has a larger room for growth because semiconductor devices with functionalities can be formed on the multilayer thin-film substrate, and thereby can greatly enhance its functionality. The semiconductor device can be, for example, passive devices, driver ICs, and thin film transistors (TFT). This type of high functionality multilayer thin-film substrate is referred to as IC integrated substrate hereafter.

In photoelectric, electronic, and semiconductor industries, as the IC integrated substrate miniaturizes in size and the quantity of functionality electronic devices which cooperate therewith increases, the level of precision required for the IC integrated substrate also rises. The manufacturing process of IC integrated substrate thus faces new challenges, especially in how to increase wiring density and/or how to combine different electronic devices to form a high functionality IC integrated substrate, both of which are important parts of industrial competitions. A key to manufacturing an IC integrated substrate is the size stability of the IC integrated substrate in the manufacturing process. A conventional solution is to manufacture the IC integrated substrate on a rigid carrier, in which the size stability of the carrier is used to increase the size stability of the IC integrate substrate during processing. However, a major issue of using this solution is the separation of the IC integrated substrate and the carrier after the fabrication of the IC integrated substrate is completed.

In U.S. Pat. No. 4,480,288, a double-sided thin, flexible circuitry is formed on an aluminum carrier, and then the aluminum carrier is removed by hydrochloric acid. In addition, U.S. Pat. No. 4,812,191 discloses a method of manufacturing a multilayer thin-film substrate comprising a multilayer interconnection structure by using a sacrificial substrate technique. In the method, a multilayer interconnection structure is formed on a carrier that has a coefficient of thermal expansion less than that of the structure, and then the temperature is elevated to perform curing, after which the temperature is lowered to generate sufficient tension between the carrier and the multilayer interconnection structure. Finally, the multilayer interconnection structure is separated from the carrier by adhering a support means to the multi-layer interconnection structure and by an acid-etching process.

U.S. Pat. No. 5,258,236 is about a method of separating a carrier and a multilayer thin-film substrate having a multilayer interconnection structure by laser ablation. Referring to FIG. 1, a polymer layer 2, a metal layer 3, and a multilayer interconnection structure 4 are sequentially formed on a transparent carrier 1. Ultraviolet light is then applied to the polymer layer 2 through the transparent carrier 1 in order to ablate the polymer 2, allowing the transparent carrier 1 to be separated from the rest of the structure.

However, the aforementioned separation methods are tedious and complex. Thus, a manufacturing method that fabricates an IC integrated substrate with high size-precision and separates the IC integrated substrate and a carrier without increasing the production cost is much needed.

SUMMARY

It is an object of the invention to provide a structure combining an IC integrated substrate and a carrier, a method of manufacturing such structure, and a method of manufacturing electronic devices using such structure, wherein the IC integrated substrate separates from the carrier in an easy, fast, and low-cost way.

In one aspect of the invention, a structure combining an IC integrated substrate and a carrier comprises a carrier and an IC integrated substrate formed on the carrier. An interface between the carrier and the IC integrated substrate has a specific area at which the interface adhesion is different from that at remaining area of the interface.

In another aspect of the invention, a method of manufacturing a structure combining an IC integrated substrate and a carrier comprises providing a carrier; performing an adhesion-differentiating process on the carrier; and forming an IC integrated substrate on the carrier. An interface between the carrier being treated by the adhesion-differentiating process and the IC integrated substrate has a specific area at which the interface adhesion is different from that at remaining area of the interface.

In still another aspect of the invention, a method of manufacturing an electronic device comprises providing a carrier; performing an adhesion-differentiating process on the carrier; forming an IC integrated substrate on the carrier, wherein an interface between the carrier being treated by the adhesion-differentiating process and the IC integrated substrate has a specific area at which the interface adhesion is different from that at remaining area of the interface; and cutting one or more pieces from the IC integrated substrate, so that each piece cut from the IC integrated substrate naturally separates from the carrier to obtain an electronic device.

The IC integrated substrate mentioned in the invention is different from the multilayer thin-film substrate used in conventional packaging process. The IC integrated substrate of the invention can have a multilayer interconnection structure for electrical connection, or at least one semiconductor device such as passive devices, electronic drivers, TFT devices, other electronic devices, or any combination thereof.

With the technical means of the invention, the IC integrated substrate and the carrier can be separated, according to the invention, by an easy, fast, and low-cost way in comparison to the conventional technology wherein complex methods like solvent and laser are used to separate a multilayer thin-film substrate and a carrier. An electronic device comprising a multilayer interconnection structure, at least one semiconductor device, or a combination thereof is thus manufactured.

DETAILED DESCRIPTION OF THE INVENTION

Figure 1:
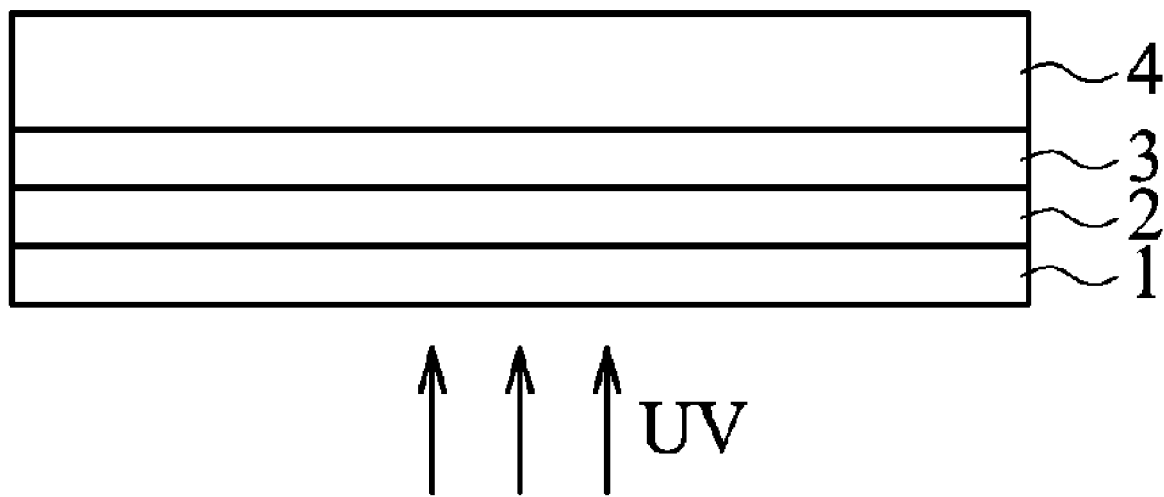
FIG. 1 shows a conventional method of separating an electronic device from a carrier by laser ablation.

The preferred embodiments of the invention will be described below with reference to the drawings, wherein similar reference numerals denote similar components.

Figure 2:
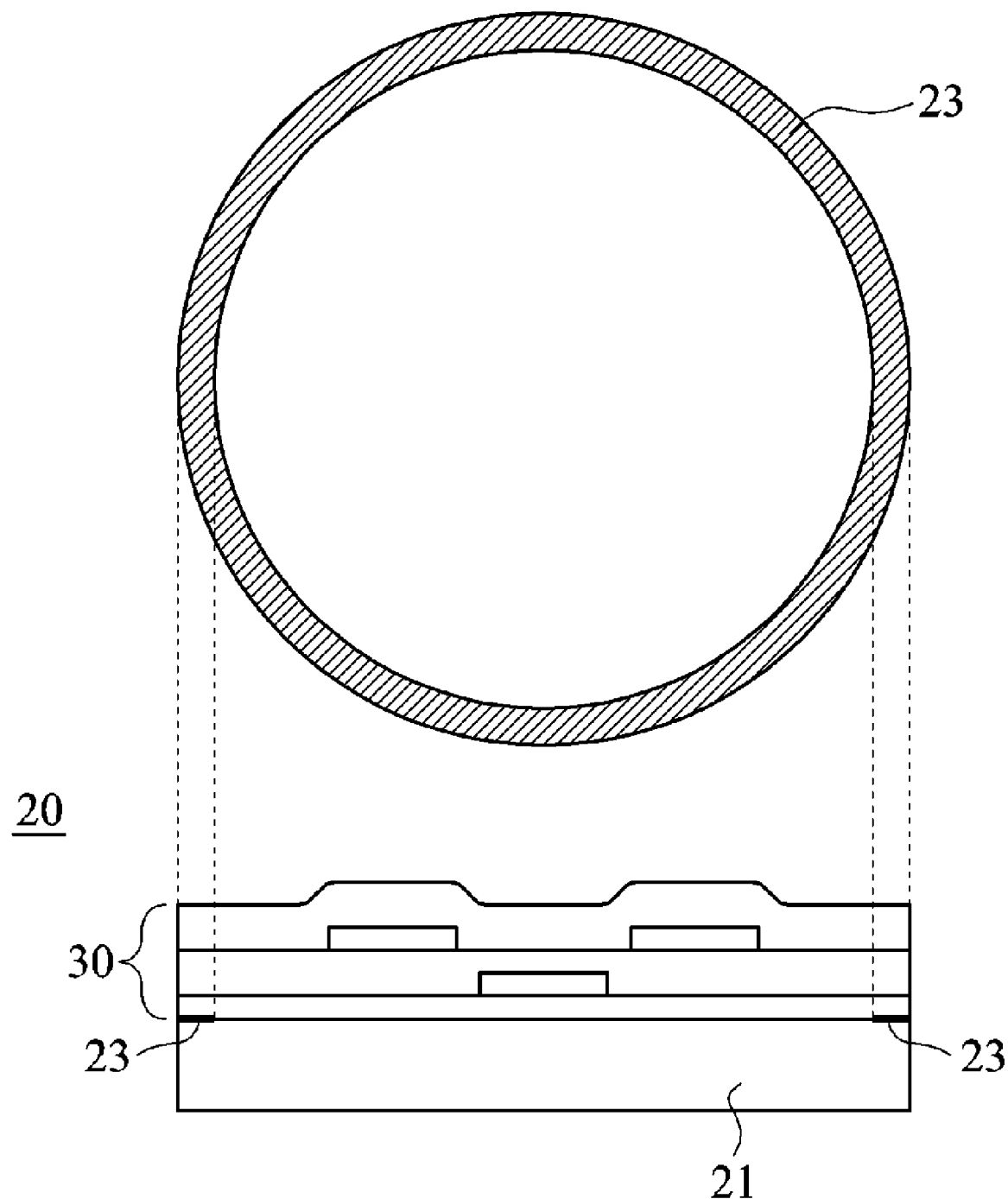
FIG. 2 schematically shows a structure combining an IC integrated substrate having at least one semiconductor device and a carrier according to an embodiment of the invention.

FIG. 2 schematically shows a structure 20 combining an IC integrated substrate 30 and a carrier 21 according to an embodiment of the invention. The upper portion of FIG. 2 illustrates a top view of the whole structure and the lower portion illustrates its cross-sectional view. The structure 20 comprises a carrier 21 and an IC integrated substrate 30 formed on the carrier 21, and the interface between the carrier 21 and the IC integrated substrate 30 has a specific area (e.g. the peripheral region 23 in this embodiment), at which the interface adhesion is different from that at remaining area of the interface. In order to easily separate the IC integrated substrate 30 from the carrier 21 in the subsequent cutting procedure, the interface adhesion at the peripheral region 23 can be stronger than that at the remaining area.

Besides, the IC integrated substrate 30 of this embodiment includes at least one semiconductor device such as passive devices, driver ICs, TFT devices, or other electronic devices. It should be noted that in FIG. 2, the IC integrated substrate 30 contains a single semiconductor device, but a person skilled in the art should know that an IC integrated substrate may contain a lot of semiconductor devices, and can be cut in subsequent procedures to make hundreds and thousands of electronic devices. The simplification herein is for easy illustration and description purposes.

Figure 3:
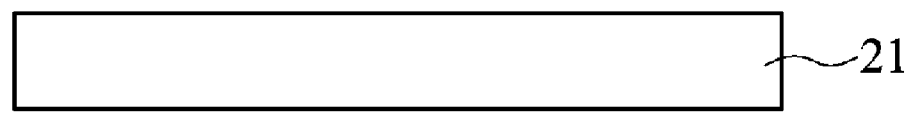
FIG. 3 shows a method of manufacturing the structure in FIG. 2 and an electronic device according to an embodiment of the invention.
Figure 3:
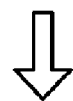
Figure 3:
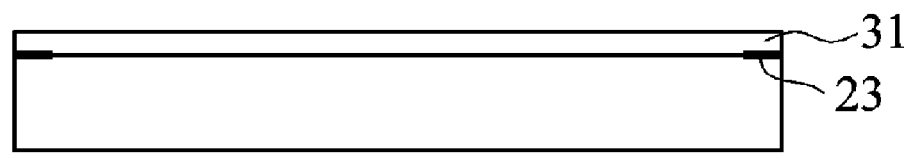
Figure 3:
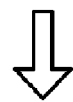
Figure 3:
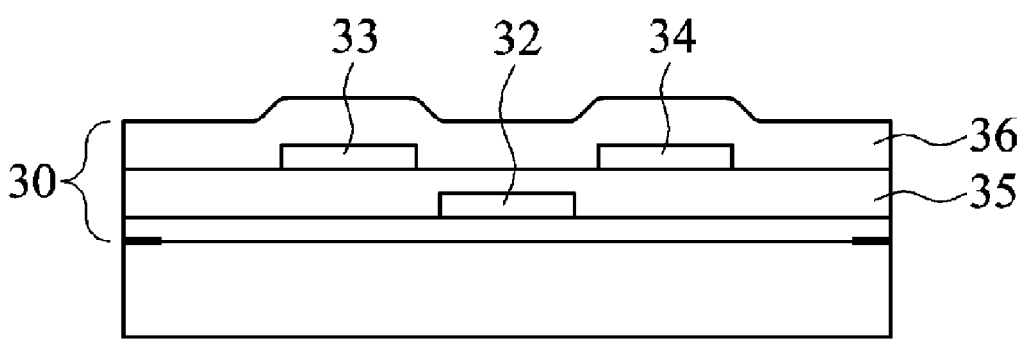
Figure 3:
Figure 3:
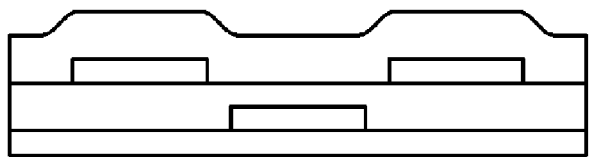

Referring to FIG. 3, a method of fabricating the above structure 20 and an electronic device 38 is described in detail. At first, the carrier 21 is provided in FIG. 3A. Next, as shown in FIG. 3B, the carrier 21 is treated by an adhesion-differentiating process, and then a bottom dielectric layer 31 of the IC integrated substrate 30 is formed on the carrier 21, so that the interface adhesion at the peripheral region 23 is stronger than that at the remaining area on the interface between the carrier 21 and the bottom dielectric layer 31. As a result of the adhesion-differentiating process, the carrier 21 and the bottom dielectric layer 31 are substantially adhered together merely in the peripheral region 23, but substantially non-adhered in the other area. In the present invention, the term "substantially adhered" means a condition that two contact surfaces are attached to each other firmly and would not be separated due to the stress produced during the subsequent processes, and the term "substantially non-adhered" means a state that interface adhesion between two contact surfaces is so weak that the two surfaces can be naturally separated, namely, they can be separated by applying little external force (e.g. by vacuum suction or tape sticking etc.) without damage to their structures.

Generally, the so-called "adhesion differentiating process" in the invention means a process that can regionally differentiate the adhesion on the interface between the carrier and the IC integrated substrate, and its procedures depend on the materials of the carrier and the bottom layer of the IC integrated substrate. For example, the adhesion-differentiating process may comprise performing an adhesion promoting treatment on some areas of the carrier, performing an adhesion reducing treatment on some areas of the carrier, performing an adhesion promoting treatment on the whole carrier and then performing an adhesion reducing treatment on some areas, or performing an adhesion reducing treatment on the whole carrier and then performing an adhesion promoting treatment on some areas.

In this embodiment, the material of the carrier 21 is a silicon wafer, and the material of the bottom dielectric layer 31 is polyimide (DuPont PI-2611) with a low dielectric constant (less than 4). Since the adhesion between these two materials is very weak (i.e. "substantially non-adhered"), the adhesion-differentiating process in this embodiment merely comprises performing an adhesion promoting treatment on the peripheral region 23. Specifically, a silane-based adhesion promoter (DuPont VM-651) is applied to the peripheral region 23 of the carrier 21 to enhance the adhesion between the carrier 21 and the bottom dielectric layer 31, and the remaining area of the carrier 21 is untreated. After spin-coated on the carrier 21, the bottom dielectric layer 31 is substantially adhered to the carrier 21 in the peripheral region 23.

Afterward, as shown in FIG. 3C, other components of a semiconductor such as a gate electrode 32, a source electrode 33, a drain electrode 34, a dielectric layer 35, and a semiconductor layer 36 etc. are formed on the bottom dielectric layer 31 to complete the IC integrated substrate 30 having a semiconductor device. Finally, in FIG. 3D, the IC integrated substrate 30 is cut into one or more pieces at some proper positions. Since the IC integrated substrate 30 (the bottom dielectric layer 31) and the carrier 21 are substantially adhered together in the peripheral region 23, but substantially non-adhered in the other area, each piece cut from the IC integrated substrate 30 can be naturally separated from the carrier 21 to obtain an electronic device 38, for example, by vacuum suction.

Compared with the conventional technology wherein the IC integrated substrate is separated from the carrier with complicated methods such as by using a solvent or laser, an electronic device having at least one semiconductor device with high size accuracy and excellent flexibility can be manufactured more easily and faster in this embodiment.

Figure 4:
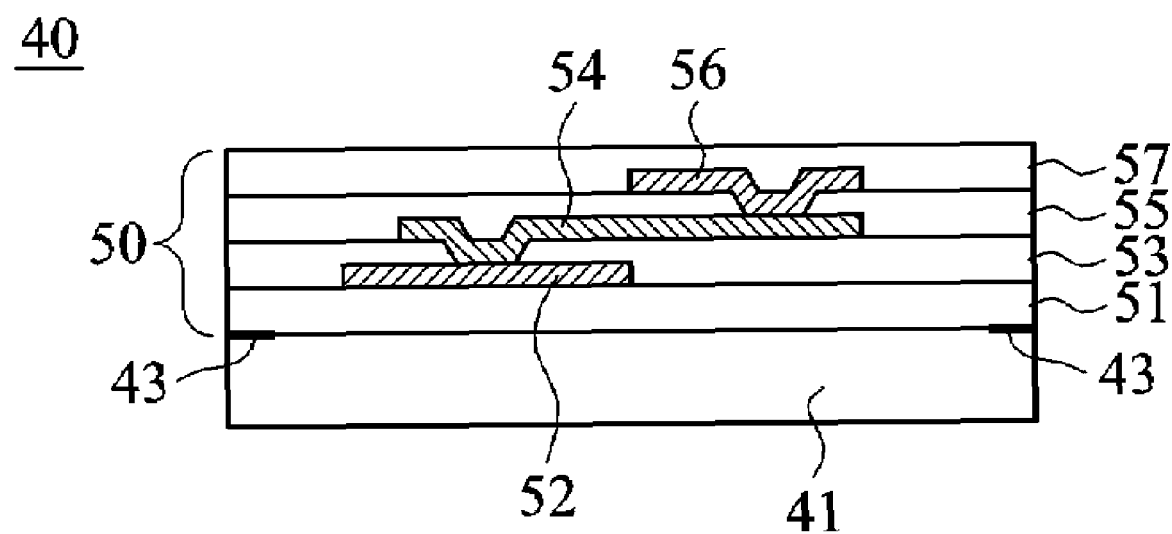
FIG. 4 schematically shows a structure combining an IC integrated substrate having a multi-layer interconnection structure and a carrier according to another embodiment of the invention.

FIG. 4 schematically shows a structure 40 combining an IC integrated substrate 50 and a carrier 41 according to another embodiment of the invention. Similar to the structure 20 in FIG. 2, the structure 40 comprises a carrier 41 and an IC integrated substrate 50 formed on the carrier 41, and on the interface between them, the adhesion at the peripheral region 43 is stronger than that at the remaining area. This embodiment is different from the above embodiment in that the IC integrated substrate 50 has a multi-layer interconnection structure, which is a double-sided substrate with both its front side and back side electrically connected to the exterior. Inside this double-sided substrate, the front side electrically connects to the back side, but the multi-layer interconnection structure can be interconnected by other methods, such as interconnecting in multiple places on one surface, or in other conditions. Moreover, the number of layers in the multi-layer interconnection structure is unlimited, and it can be appropriately adjusted according to different applications.

In this embodiment, a silicon wafer is used as the carrier 41, and the IC integrated substrate 50 having a multi-layer interconnection structure is formed by sequentially laminating dielectric layers and metal layers on the carrier 41, wherein each of the dielectric layers 51, 53, 55, and 57 is made of polyimide (DuPont PI-2611) with a low dielectric constant (less than 4); the upper metal layer 56 and the lower metal layer 52 are under bump metal (UBM) with Cr/Cu/Ni/Au structure for subsequent electrical connection to solder balls; and the middle metal layer 54 is multi-layer metal wires of Cr/Cu/Cr. Besides, the dielectric layers 53, 55, and 57 of the multi-layer interconnection structure can be perforated by etching or laser drilling so that the metal interconnections can electrically connect to one another, or to the exterior.

During the fabrication of the structure 40, since the adhesion between the carrier 41 (silicon wafer) and the dielectric layer 51 (polyimide) is very weak (i.e. "substantially non-adhered"), the adhesion-differentiating process in this embodiment merely comprises performing an adhesion promoting treatment on the peripheral region 43. Its procedures are the same as those in FIG. 3, and not described herein for simplification. After the adhesion-differentiating process and the spin coating process, the dielectric layer 51 is substantially adhered to the carrier 41 only in the peripheral region 43. Then, the metal layer 52, the dielectric layer 53, the metal layer 54, the dielectric layer 55, the metal layer 56, and the dielectric layer 57 are sequentially stacked on the dielectric layer 51 to form the IC integrated substrate 50. At last, the IC integrated substrate 50 is cut into one or more pieces at some proper positions. Since the IC integrated substrate 50 (the dielectric layer 51) and the carrier 41 are substantially adhered together in the peripheral region 43, but substantially non-adhered in the other area, each piece cut from the IC integrated substrate 50 can be naturally separated from the carrier 41 to obtain an electronic device, for example, by vacuum suction.

Similarly, compared with the conventional technology wherein the IC integrated substrate is separated from the carrier with complicated methods such as by using a solvent or laser, an electronic device having a multi-layer interconnection structure with high size accuracy and excellent flexibility can be manufactured more easily and faster in this embodiment.

It is to be noted that the carrier in the invention can be all types of solid material, including metal, glass, ceramic, silicon wafer, sapphire, gallium arsenide, polyimide (PI), etc. The dielectric layers can be any organic material, including PI, benzo-cyclobutene (BCB), poly(methyl-methacrylate) (PMMA), liquid crystal polymer (LCP), etc.

Besides, the procedures of the adhesion-differentiating process in the invention may be properly adjusted in the light of the above materials. In one embodiment, it comprises performing an adhesion promoting treatment on a specific area of the carrier, which can be achieved by using the original characteristic of the carrier, or by methods of enhancing surface energy like plasma treatment, or by using material that enhances the interaction and crosslink between interface particles, such as a silane-based promoter. Table 1 illustrates examples of various methods of adhesion promoting treatment that can be selected for different materials of the carrier and the dielectric layer; however, the method is not limited thereto.

TABLE 1

| Material of carrier | Material of dielectric layer | Method of adhesion promoting treatment (on treated area) | Remaining area |
|---|---|---|---|
| Silicon<br>Silicon dioxide<br>Glass<br>Silicon Nitride<br>Aluminum | Polyimide<br>Benzo-cyclobutene | Apply a silane-based adhesion promoter | Untreated |
| Silicon | Polyimide<br>Benzo-cyclobutene | 1. Apply special PI (Durimide 9005 of Fujifilm)<br>2. Cure PI<br>3. Perform plasma treatment on the whole carrier | Untreated, and during the plasma treatment, no mask is needed for shielding |
| Silicon<br>Silicon dioxide<br>Glass<br>Silicon nitride<br>Aluminum<br>Ceramic | Polyimide<br>Benzo-cyclobutene | Deposit a chromium film by physical vapor deposition (PVD) | Untreated, and during deposition of the chromium film, a mask is needed for shielding |

In another embodiment, the adhesion-differentiating process comprises performing an adhesion promoting treatment on the whole carrier and then performing an adhesion reducing treatment on a specific area. For instance, if the materials of the carrier and the dielectric layer are silicon and PI respectively, the adhesion promoting treatment can be achieved by coating PI on the whole carrier and then performing Ar plasma treatment on the whole carrier. Next, a silane-based material (e.g. DuPont VM-651) is applied on the specific area by ink jetting or dispensing. After baking, the dielectric layer is coated on the carrier. In this case, since the silane-based material can reduce the interface adhesion between PI and PI, the adhesion at the specific area applied with the promoter is weakened (i.e. adhesion reducing treatment).

In yet another embodiment, the adhesion-differentiating process comprises performing an adhesion reducing treatment on a specific area. For example, if the materials of the carrier and the dielectric layer are silicon and PI respectively, PI is firstly applied on the specific area of the carrier by ink jetting or dispensing, and then the dielectric layer containing a silane-based material (e.g. DuPont VM-651) is coated on the carrier. In this case, since the dielectric layer contains the silane-based adhesion promoter and the specific area is applied with PI, the adhesion at the specific area is weakened (i.e. adhesion reducing treatment). On the other hand, the interface adhesion at the other area between the carrier and the dielectric layer can be enhanced by the silane-based material.

It should be realized that the aforementioned embodiments are merely exemplary, but not limitative. The purpose of the "adhesion differentiating process" in the invention is to regionally differentiate the adhesion on the interface between the carrier and the IC integrated substrate, and its procedures can be properly modified according to the needs of different processes. Generally, in order to achieve the purpose of the "adhesion differentiating process," the interface adhesion between the carrier and the IC integrated substrate can be controlled by referring to the adhesion theory recited in the following references:

1. Berg, J. C., "Wettability" Marcel Dekker, Inc., New York, 1993.
2. Fowkes, F. M., "Contact Angle, Wettability, and Adhesion" American Chemical Society, Washington, D.C., 1964.
3. Shiue, J. H., "The complete book of Adhesives", Gaulih, Taipei, 1985.

The theory explains three criteria for adhesion: wetting, solidification, and sufficient deformation for reducing elastic pressure during bonding, and by keeping these three principles in mind one can select and control adhesion to get the effect needed by the invention; the three principles will be described in detail.

For wetting, one can refer to Cooper & Nuttall theory, wherein the criterion for wetting the surface of a solid s with a liquid l is:

$$S = \gamma_s - \gamma_l - \gamma_{sl}$$

Wet: S>0
Not wet: S<0
$\gamma_s$=The free energy of solid surface in saturated vapor atmosphere
$\gamma_l$=The free energy of liquid surface in saturated vapor atmosphere
$\gamma_{sl}$=The free energy of the solid/liquid interface
S=Initial spreading coefficient The material of a dielectric layer formed by coating can be selected based on the wetting principle, where the final adhesion is stronger when the S value is larger and the final adhesion is weaker when the S value is smaller. Based on the principle, surface treatment can be used to suitably change free energy, and thus enhance or diminish the adhesiveness of the layer, to achieve the adhesion result required by the invention. Because the actual value of the adhesion is greatly affected by process quality, persons skilled in the art should understand that the principle is a qualitative result and that the actual S value is not to be used for specific applications. However, by trial and error, a suitable adhesion between the carrier and the dielectric layer in the invention can be obtained, and thus the effect of natural separation as suggested by the invention can be achieved.

The wetting principle also applies to dielectric layers formed by non-coating methods like lamination and cold forging because plastic flow would form at the microscopic contact points of these methods. And since the product of the invention must be solid, it naturally conforms to the solidification principle.

Dielectric layers formed by non-coating methods also need to fully consider the deformation principle. If the contact surface can completely deform during processing, the adhesion would be stronger, otherwise it would be weaker. By appropriately utilizing these principles, the natural separation effect of the invention can be achieved.

Figure 5:
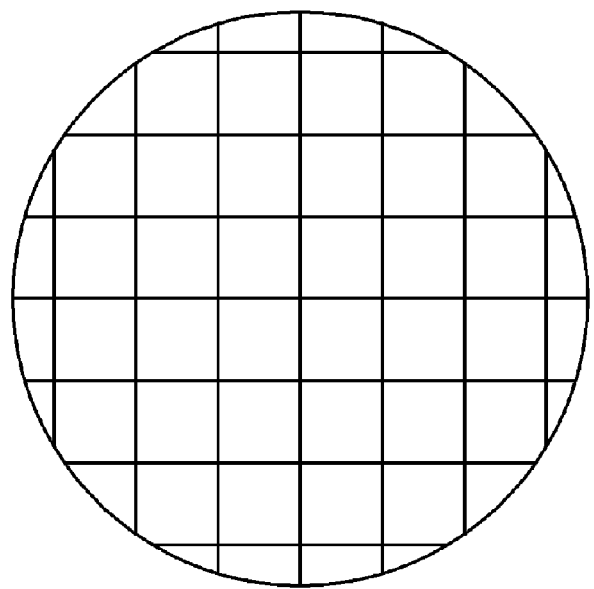
FIG. 5 shows the specific area with different interface adhesion from the other area in a form of grids.
Figure 6:
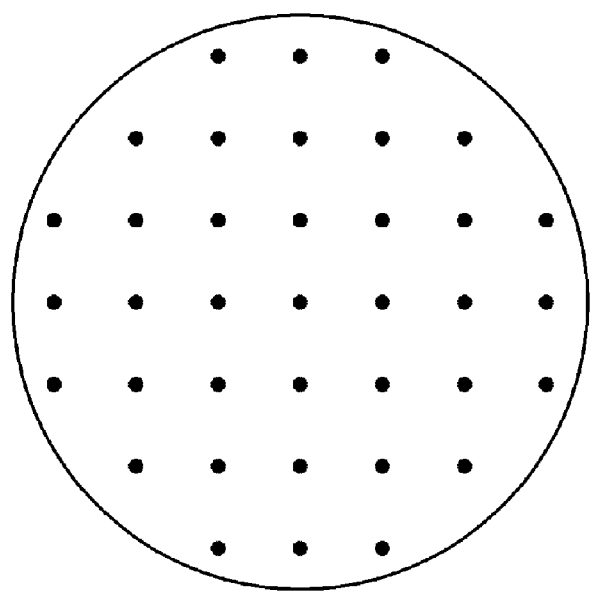
FIG. 6 shows the specific area with different interface adhesion from the other area in a form of spots.

Additionally, in the embodiments illustrated by FIGS. 2 and 4, the specific area, at which the interface adhesion is different from the other area, is located at the periphery of the carrier, but it can be in other locations and in any shape, such as in grids or spots, so long as defects like bubbling or delamination do not occur in subsequent processes. FIGS. 5 and 6 show the specific area in a form of grids and in a form of spots respectively.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A structure combining an IC integrated substrate and a carrier, comprising: a carrier; and an IC integrated substrate formed on the carrier, wherein an interface between the carrier and the IC integrated substrate has a specific area at which the interface adhesion is different from that at remaining area of the interface, and wherein the IC integrated substrate comprises a multi-layer interconnection structure arranged corresponding to the remaining area of the interface.

2. The structure as described in claim 1, wherein the interface adhesion at the specific area is stronger than that at the remaining area.

3. The structure as described in claim 1, wherein the specific area is a peripheral region of the carrier.

4. The structure as described in claim 1, wherein the specific area is in a form of spots.

5. The structure as described in claim 1, wherein the specific area is in a form of grids.

6. A structure combining an IC integrated substrate and a carrier, comprising: a carrier; and an IC integrated substrate formed on the carrier, wherein an interface between the carrier and the IC integrated substrate has a specific area at which the interface adhesion is different from that at remaining area of the interface, and wherein the IC integrated substrate comprises at least one semiconductor device arranged corresponding to the remaining area of the interface.

7. The structure as described in claim 6, wherein the interface adhesion at the specific area is stronger than that at the remaining area.

8. The structure as described in claim 6, wherein the specific area is a peripheral region of the carrier.

9. The structure as described in claim 6, wherein the specific area is in a form of spots.

10. The structure as described in claim 6, wherein the specific area is in a form of grids.

11. The structure as described in claim 6, wherein the semiconductor device is disposed inside the IC integrated substrate.

* * * * *